United States Patent
Nakamura et al.

(10) Patent No.: US 6,306,762 B1
(45) Date of Patent: Oct. 23, 2001

(54) SEMICONDUCTOR DEVICE HAVING MULTI-LAYERED METALIZATION AND METHOD OF MANUFACTURING THE SAME

(75) Inventors: Makiko Nakamura; Yasuhiro Fukuda; Yasuyuki Tatara; Yusuke Harada; Hiroshi Onoda, all of Tokyo (JP)

(73) Assignee: Electric Industry Co., Ltd., Tokyo (JP)

( * ) Notice: Subject to any disclaimer, the term of this patent is extended or adjusted under 35 U.S.C. 154(b) by 1116 days.

(21) Appl. No.: 08/760,557

(22) Filed: Dec. 4, 1996

Related U.S. Application Data

(60) Continuation of application No. 08/467,296, filed on Jun. 6, 1995, now abandoned, which is a division of application No. 08/128,576, filed on Sep. 30, 1993, now abandoned.

(30) Foreign Application Priority Data

Oct. 2, 1992  (JP) .................................................. 4-264559

(51) Int. Cl.$^7$ ................................................. H01L 21/4763
(52) U.S. Cl. ............................ 438/648; 438/653; 438/656
(58) Field of Search ..................................... 437/189, 190, 437/192, 194, 197, 198, 199, 246; 257/761, 763, 765; 438/648, 653, 656

(56) References Cited

U.S. PATENT DOCUMENTS

| | | | |
|---|---|---|---|
| 3,939,047 | 2/1976 | Tsunemitsu et al. ................. | 257/761 |
| 4,556,897 | * 12/1985 | Yozikane et al. ..................... | 257/765 |
| 4,816,424 | * 3/1989 | Watanabe et al. .................... | 437/190 |
| 4,824,803 | * 4/1989 | Us et al. ................................ | 437/192 |
| 4,926,237 | 5/1990 | Sun et al. .............................. | 257/765 |
| 4,977,440 | 12/1990 | Stevens ................................... | 357/68 |
| 4,980,752 | 12/1990 | Jones, Jr. ............................... | 257/765 |
| 4,990,995 | 2/1991 | Maa . | |
| 5,070,036 | 12/1991 | Stevens ................................. | 437/190 |
| 5,231,053 | * 7/1993 | Bost et al. ............................ | 437/190 |
| 5,313,100 | * 5/1994 | Ishii et al. ............................ | 257/751 |
| 5,345,108 | * 9/1994 | Kikkawa ................................ | 257/751 |
| 5,371,042 | * 12/1994 | Ong ...................................... | 437/194 |
| 5,397,744 | * 3/1995 | Sumi et al. ............................ | 437/200 |

FOREIGN PATENT DOCUMENTS

| | | |
|---|---|---|
| 0 502 647 | 9/1992 | (EP) . |
| 0 516 279 | 12/1992 | (EP) . |

OTHER PUBLICATIONS

Nicollet, M., "Diffusion barriers in Thin Films", Thin Solid Films, Aug. 1978, vol. 52, pp. 415–443, Aug. 1978.*
T. Kikkawa et al, "A Quarter–micron Interconnection Technology Using Ai–SI–Cu/TiN Alternated Layers", International Electronic Devices Meeting, Dec. 1991, Washington, D.C., pp. 281–284.
Hiroshi Onoda et al, "Analysis of Electromigration–Induced Failures in Multilayered Interconnects", Sep. 9, 1993, IEEE Transactions on Electron Devices, pp. 1614–1619.

* cited by examiner

Primary Examiner—T. N. Quach
(74) Attorney, Agent, or Firm—Rabin & Berdo, P.C.

(57) ABSTRACT

A semiconductor having multi-layer metalization which has a metal layer between aluminum alloy and metal nitride layers, that prevents failure of interconnects when electromigration causes a discontinuity in the aluminum alloy layer. In a one embodiment, the metal of the metal layer and the metal of the nitride layer are both the same metal, such as titanium. In a method of manufacturing the semiconductor device, an insulating layer is formed on a surface of a semiconductor substrate, and in vacuum chambers, the alloy layer is-formed on the insulating layer, a metal layer is formed on the alloy layer, and a metal nitride layer is formed on the metal layer in an nitrogen atmosphere. Sputtering, such as RF-bias sputtering, or thermal evaporation deposition, may be used to apply the respective nitride, metal and alloy layers. If the same metal is used for the metal layer and the nitride layer, the same vacuum chamber may be used to apply both layers, by replacing an inert gas atmosphere used during metal layer deposition by a nitrogen gas atmosphere for use during the nitride layer deposition.

16 Claims, 3 Drawing Sheets

SEMICONDUCTOR DEVICE HAVING MULTI-LAYERED METALIZATION AND METHOD OF MANUFACTURING THE SAME

CROSS-REFERENCE RELATED APPLICATION

This is a Continuation application of Ser. No. 08/467,296, filed Jun. 6, 1995, (now abandoned) which was a divisional application of Ser. No. 08/128,576, filed on Sep. 30, 1993, (now abandoned).

This application claims the priority benefits of Japanese application No. 4264599, filed Oct. 2, 1992, the entire disclosure of which is incorporated herein by reference.

BACKGROUND OF THE INVENTION

1. Field of the Invention

This invention relates to a semiconductor device having a metalized multi-layer interconnect and a method for manufacturing the semiconductor device.

2. Description of Related Art

Interconnection metalizations for interconnects of semiconductor devices, are typically formed by a single layer of an aluminum alloy, or are multi-layer metalizations. Known multilayer metalizations are composed of a bottom, refractory metal layer, such as TiN, TiW, or the like, serving as a diffusion barrier layer, and a top aluminum alloy layer. Reductions in the size of semiconductor devices has led to the use of a further metal nitride layer as a top layer of an aluminum alloy interconnect. Use of a top metal nitride layer in this manner can serve, among other purposes, to prevent irregular reflection from the aluminum alloy layer in photolithographic processes, and to prevent the occurrence of hillocks. A metal nitride layer may be formed on an aluminum alloy layer by a reactive sputtering process.

In such interconnection metalizations for semiconductor devices, a lower resistance at the boundary of the aluminum alloy layer and the metal nitride layer is desirable. However, if the surface of an aluminum alloy layer is exposed to an atmosphere containing oxygen, while the metal nitride of the top layer is being formed by reactive sputtering, an oxide layer will form on the surface of the aluminum alloy layer. Such an oxide layer serves to electrically insulate the metal nitride from the aluminum alloy. Even when the interconnection metalization is formed in a vacuum chamber, the surface of the aluminum alloy layer is nitrided by exposure to a nitrogen plasma during the reactive sputtering, which increases the electrical resistance of the boundary between the metal nitride and aluminum alloy layers.

Tests have been performed on a triple layer interconnect composed of respective layers of titanium nitride, aluminum alloy, and titanium nitride (TiN/Al alloy/TiN), to measure the effect of the bottom nitride layer on electrical resistance and electromigration. In a double layer interconnect, formed of a bottom aluminum alloy layer and a top titanium nitride layer (TiN/Al alloy), a discontinuity in the aluminum alloy layer, such as would be caused by electromigration, results in a sudden failure of the interconnect (an open circuit).

When the triple layer interconnect was tested, a sudden failure of the interconnect did not result, because the lower titanium nitride layer served as a current path. However, the bottom nitride layer serves not only as an alternate current path, but also as a diffusion barrier into which atoms diffuse from the substrate below. As a result of such diffusion, the electrical resistance of the bottom nitride layer, and thus of the current path, gradually increased until the interconnect failed.

SUMMARY OF THE INVENTION

An object of the invention is to provide a semiconductor device having a conductive multi-layer metalization, that includes an aluminum alloy layer, and that continues to conduct even if the alloy layer is severed or is otherwise nonconducting.

Another object of the invention is to provide a semiconductor device having a multi-layer interconnection metalization, wherein the metalization layer has low electrical resistivity at an interface between an aluminum alloy layer and a metal nitride layer formed thereon.

A further object of the invention is to provide a semiconductor device with a multi-layer interconnection metalization highly resistant to failure due to electromigration.

Yet another object of the present invention is to provide a method of manufacturing a semiconductor device that meets the above objects, without increasing the number of required process steps.

To achieve the above objects, there is provided a semiconductor having multi-layer metalization, the multi-layer metalization including (a) an aluminum alloy layer; (b) a metal layer formed on the alloy layer; and (c) a metal nitride layer formed on the metal layer. In a one embodiment, the metal of the metal layer and the metal of the nitride layer are both formed of the same metal, such as titanium.

Tests performed by the inventors have shown that the metal layer prevents failure of interconnects when electromigration causes a discontinuity in the aluminum alloy layer, by assuring a low resistance boundary between the metal nitride layer and the alloy layer. Greater reliability can be obtained also with interconnects formed in two or more metal nitride/metal/aluminum alloy metalization levels, with an intervening insulation layer between successive levels, wherein the aluminum alloy layers of the successive levels are in direct contact through vias in the insulation layers.

The above objects of the invention can be further achieved, by a method of manufacturing a semiconductor device having multi-layer metalization, wherein an insulating layer is formed on a surface of a semiconductor substrate, and an aluminum alloy layer is formed on the insulating layer in a first vacuum chamber, a metal layer is formed on the alloy layer in a second vacuum chamber, and a metal nitride layer is formed on the metal layer in an nitrogen atmosphere within a third vacuum chamber. Sputter methods, such as RF-bias sputtering, or other physical vapor deposition methods such as evaporation, may be used to apply the respective nitride, metal and alloy layers.

According to another aspect of the invention, wherein the same metal is used for both the metal layer and the metal nitride layer, both of these layers are applied within the same vacuum chamber. First, the metal layer is applied in an atmosphere of inert gas such as argon gas, within a vacuum chamber. Then, the vacuum chamber is evacuated and a nitrogen gas atmosphere is provided. The nitride layer then is applied in this nitrogen gas atmosphere within the same vacuum chamber.

BRIEF DESCRIPTION OF THE DRAWINGS

The above and other objects and features of the invention will be apparent to those skilled in the art from the following description of preferred embodiments thereof, considered in conjunction with the accompanied drawings of which.

DETAILED DESCRIPTION OF THE PREFERRED EMBODIMENTS

Figure 1:
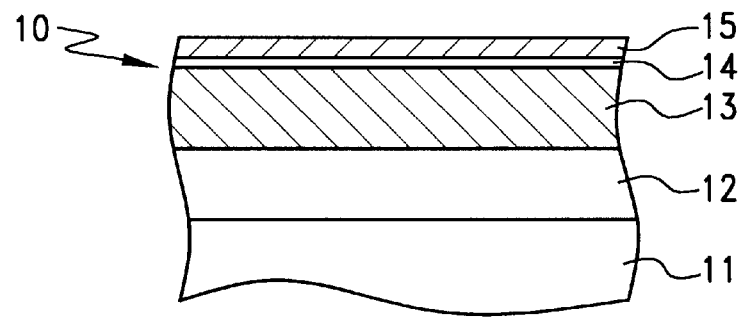
FIG. 1 is a cross-sectional view of an interconnect of a first embodiment of the invention.

Referring to FIG. 1, a semiconductor device having a multi-layer interconnect 10, according to a first preferred embodiment of the invention, is shown. On a surface of a semiconductor substrate 11 formed with transistors (not shown) or the like, an insulating layer 12 is deposited using a chemical vapor deposition (CVD) process. An aluminum alloy layer 13, for example, a layer containing 98.5 wt. % Al (aluminum), 1 wt. % Si (silicon), and 0.5 wt. % Cu (copper), and having a thickness of about 6,000 Å, is formed on the insulating layer 12 by a sputtering process. A titanium layer 14 having a thickness of about 100 Å, and a titanium nitride layer 15 having a thickness of about 1,000 Å, are successively deposited on the aluminum alloy layer 13 to produce a multilayer interconnection metalization. Subsequent patterning of the metalization produces interconnects 10.

Figure 5:
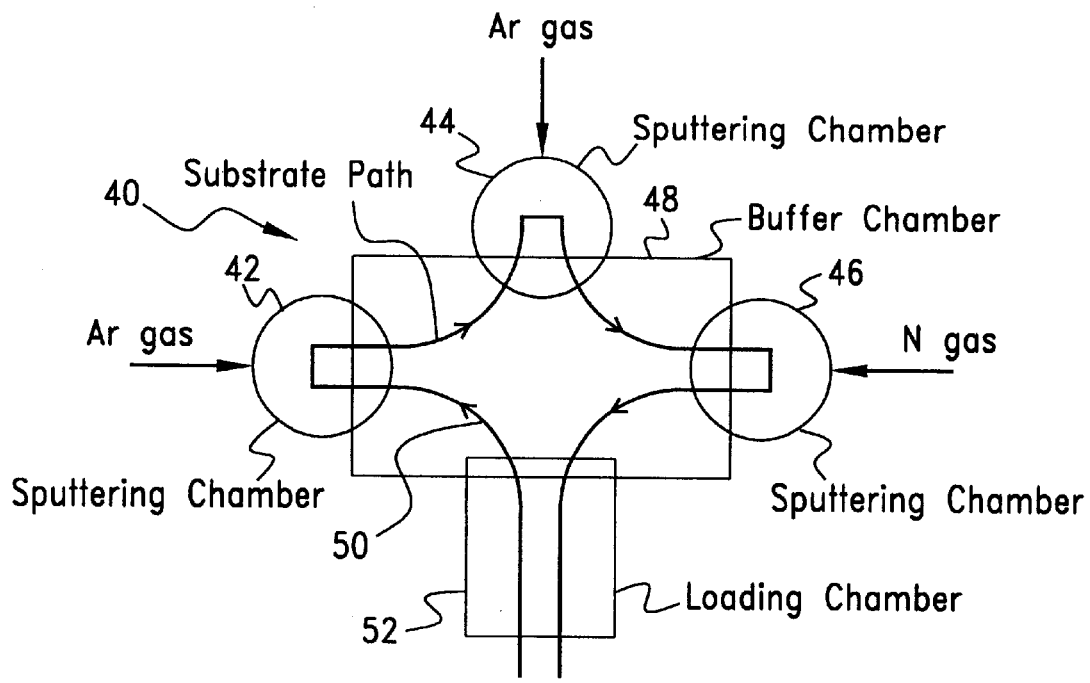
FIG. 5 schematically illustrates a sputtering apparatus for applying a multilayer interconnection metalization to a substrate according to an embodiment of the invention.

In order to form the interconnection metalization on the substrate, a multi-chamber sputtering apparatus is employed. Such a multi-chamber apparatus is schematically illustrated in FIG. 5. Referring to FIG. 5, the sputtering apparatus 40 has separate sputtering chambers 42, 44 and 46 for aluminum, titanium, and titanium nitride, respectively. The sputtering chambers surround a buffer vacuum chamber 48. The apparatus is controlled to move the substrate along a path 50 between the sputtering chambers via the buffer chamber, to deposit successive layers on the substrate. Each sputtering chamber can be independently controlled to receive a gas or gases and to satisfy required process conditions, such as the DC power, gas pressure, and chamber temperature. The buffer chamber also is connected to a loading chamber 52 for loading and unloading substrates to be subjected to sputter processing.

To form the multi-layer interconnection metalization, first the substrate 11 with the insulating layer 12 is loaded in the loading chamber 52. The substrate is then transported through the buffer chamber 48 to the sputtering chamber 42. In the sputtering chamber 42, the aluminum alloy layer 13 is deposited on the substrate. Suitable process conditions for such a deposition are, for example, a DC power of 12 kW, a pressure of 2 mTorr, a deposition temperature of 250° C., a deposition speed of up to 200 Å/sec, and an atmosphere consisting entirely of an inert gas, such as argon (Ar) gas. After the aluminum alloy layer 13 is formed on the substrate 11, the substrate 11 is moved through the buffer chamber 48 to the sputtering chamber 44. In the sputtering chamber 44, the titanium layer 14 is deposited on the aluminum alloy layer 13. Suitable process conditions for the titanium deposition are, for example, a DC power of 1.5 kW, a pressure of 4 mTorr, a deposition temperature of 20° C. (room temperature), a deposition speed of up to 15 Å/sec, and an atmosphere consisting entirely of an inert gas, such as argon (Ar) gas.

The substrate 11 then is moved through the buffer chamber to the sputtering chamber 46, where the titanium nitride layer 15 is deposited on the titanium layer 14. Suitable conditions for the titanium nitride deposition are, for example, a DC power of 6 kW, a pressure of 4 mTorr, a deposition temperature of 20° C. (room temperature), a deposition speed of up to 10 Å/sec, and an atmosphere consisting entirely of nitrogen ($N_2$) gas. Since the aluminum alloy layer 13 is already covered by the titanium layer 14 prior to formation of the titanium nitride layer 15, the surface of the aluminum alloy layer 13 is not nitrided when the titanium nitride layer 15 is deposited in a nitrogen gas atmosphere.

According to a modified process of forming the multilayer interconnection metalization, only two sputtering chambers are required. That is, a single common sputtering chamber, controllable to change the gaseous atmosphere, and of conventional design, can be used for sputter deposition of the respective titanium and titanium nitride layers.

Figure 6:
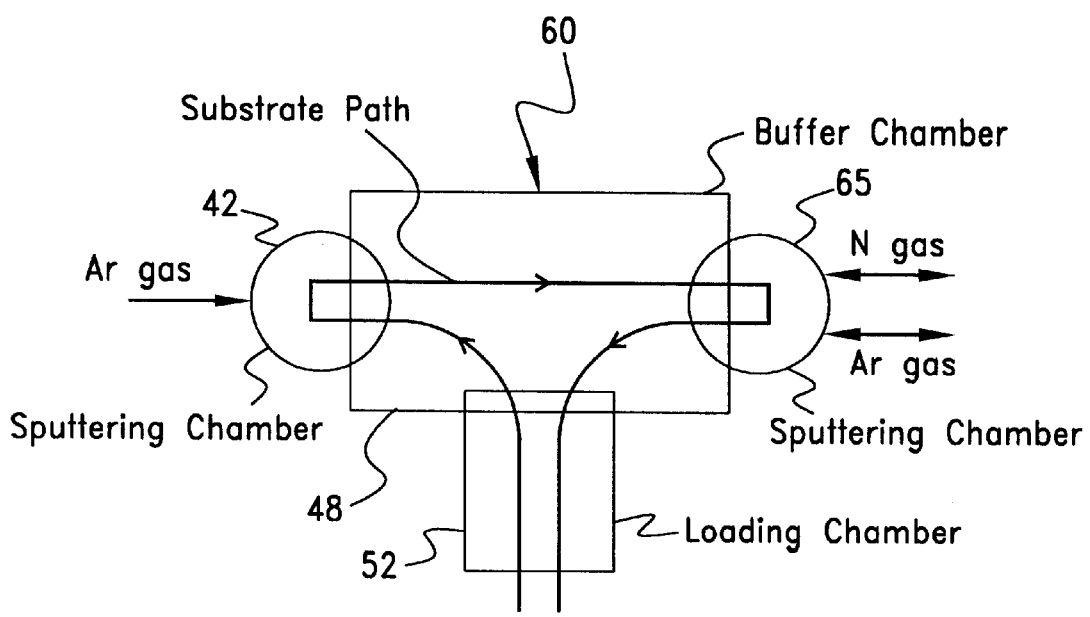
FIG. 6 is a schematic illustration of another sputtering apparatus for applying a multilayer interconnection metalization to a substrate.

FIG. 6 illustrates such a modified arrangement, wherein the same reference numerals as in FIG. 5 designate the same or corresponding elements. In the multi-chamber apparatus 60 of FIG. 6, the sputtering chambers 44 and 46 of FIG. 5 are replaced by a common sputtering chamber 65. The aluminum alloy layer is applied to the substrate in the sputtering chamber 42. Then, the titanium layer 14 is deposited on the aluminum alloy layer 15 in the common sputtering chamber 65 while the chamber contains an argon gas. The argon gas is exhausted from the chamber 65 and then replaced by a nitrogen gas atmosphere. The titanium nitride layer 15 then is deposited on the titanium layer 14 in the same chamber 65.

Following the deposition steps, the deposited layers are etched using photolithographic techniques, to form interconnects. During this photolithography process, the titanium nitride layer 15 serves as an anti-reflecting metal layer.

Figure 2:
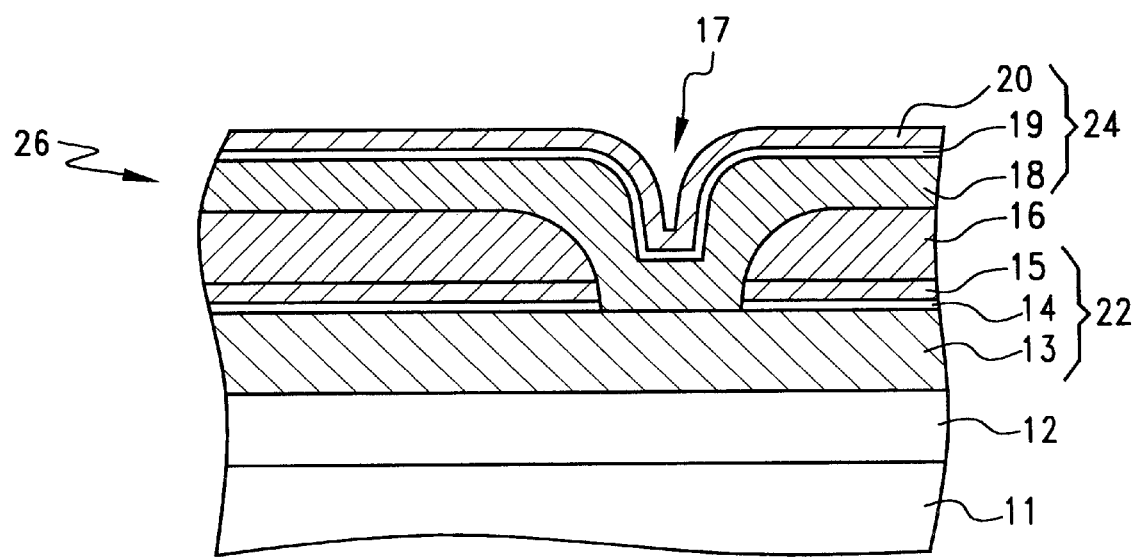
FIG. 2 is a cross-sectional view of interconnects in two levels according to a second embodiment of the invention.

FIG. 2 illustrates another semiconductor device 26 having multi-layer interconnects 22 and 24 formed in two levels, according to a second preferred embodiment of the invention. Each level has a structure like the metalization of the first embodiment. The two levels are separated only by an insulating layer 16.

To produce the device 26, first sputter processes, and patterning by etching using photolithographic techniques, as described above regarding the first embodiment, are performed to provide the first level of multilayer interconnects 22 on the insulating layer 12. Interconnects 22, therefore, include in succession, an aluminum alloy layer 13, a titanium layer 14 and a titanium nitride layer 15. Then, an intermediate insulating layer 16 is deposited over the patterned first level so as to cover the nitride layer. Through holes 17 known as "vias" then are formed through the intermediate insulating layer 16, nitride layer 15 and metal layer 14. Sputtering processes are performed to deposit an aluminum alloy layer 18, a titanium layer 19, and a titanium nitride layer 20 successively on the intermediate insulating layer 16, and then patterning is performed, to form the second level of multilayer interconnects 24, in the same manner used to form the first level.

Figure 3A:
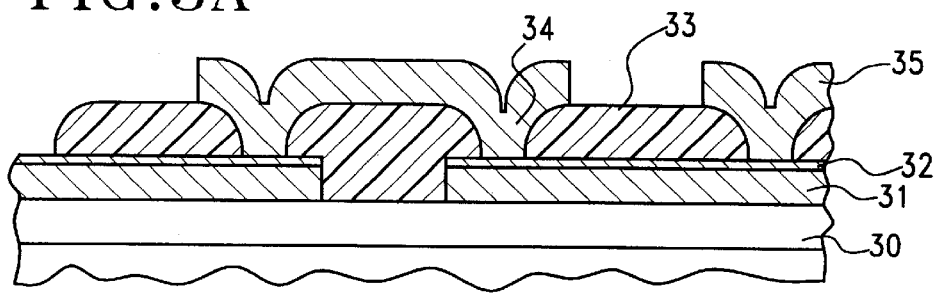
FIGS. 3A and 3B are schematic cross-sectional views of test devices used to evaluate the effectiveness of the invention.
Figure 3B:
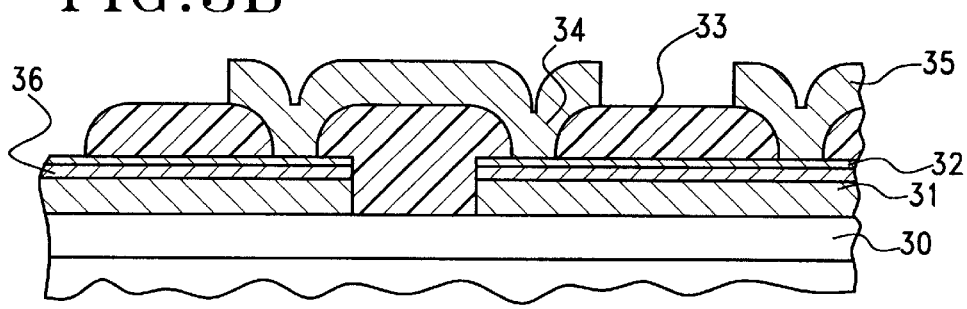

FIGS. 3A and 3B show a cross-sectional view of interconnects whose electrical resistance at the boundary between a titanium nitride layer and an aluminum alloy layer were compared to determine the effectiveness of the invention. FIGS. 3A and 3B respectively illustrate a two-layer interconnect, and the three-layer arrangement of the invention. In FIG. 3B, the numeral 30 designates an insulating layer. On the insulating layer 30, an aluminum alloy layer 31, a titanium layer 36, and a titanium nitride layer 32 (TiN/Ti/Al alloy) are formed. The layers 31, 36 and 32 are patterned to form interconnects. The numeral 33 designates an intermediate insulating layer in which a chain of 1.2 μm diameter vias 34 are formed, another patterned aluminum alloy layer 35 being connected to the titanium nitride layer through the vias. The two-layer interconnect (layers 31 and 32) of FIG. 3A differs from the three-layer interconnect of FIG. 3B only by the absence of titanium layer 36.

To compare the resistances of the respective metal nitride/ aluminum alloy boundaries, the electrical resistance between the upper aluminum alloy layer 35 and the lower aluminum alloy layer 31, in each device (FIGS. 3A and 3B) were measured and compared. The electrical resistance of the metal and nitride layers for the multi-layer interconnect of FIG. 3B, formed of the aluminum alloy layer, the titanium layer, and the titanium nitride layer (TiN/Ti/Al alloy) according to this invention, was measured to be only about 0.27 Ω.

The two-layer interconnect of FIG. 3A was produced for this test in two ways. First, such an interconnect was produced in such a manner that it was exposed to a room atmosphere after the lower aluminum alloy layer 31 was deposited. In that case, the boundary between the titanium nitride (TiN) and aluminum alloy (Al alloy) was determined to be non-conductive. Such a test device according to FIG. 3A, with a two-layer interconnect of titanium nitride (TiN) and aluminum alloy (Al alloy), also was produced with the titanium nitride layer 32 formed in a vacuum after the aluminum alloy layer 31 was deposited. In that case, the electrical resistance at the vias 34 was measured to be 2.0 Ω. Thus, the embodiment according to the invention had almost an order of magnitude lower resistance, and provides sufficient conductance between the upper metal nitride layer and the lower aluminum alloy layer.

Figure 4:
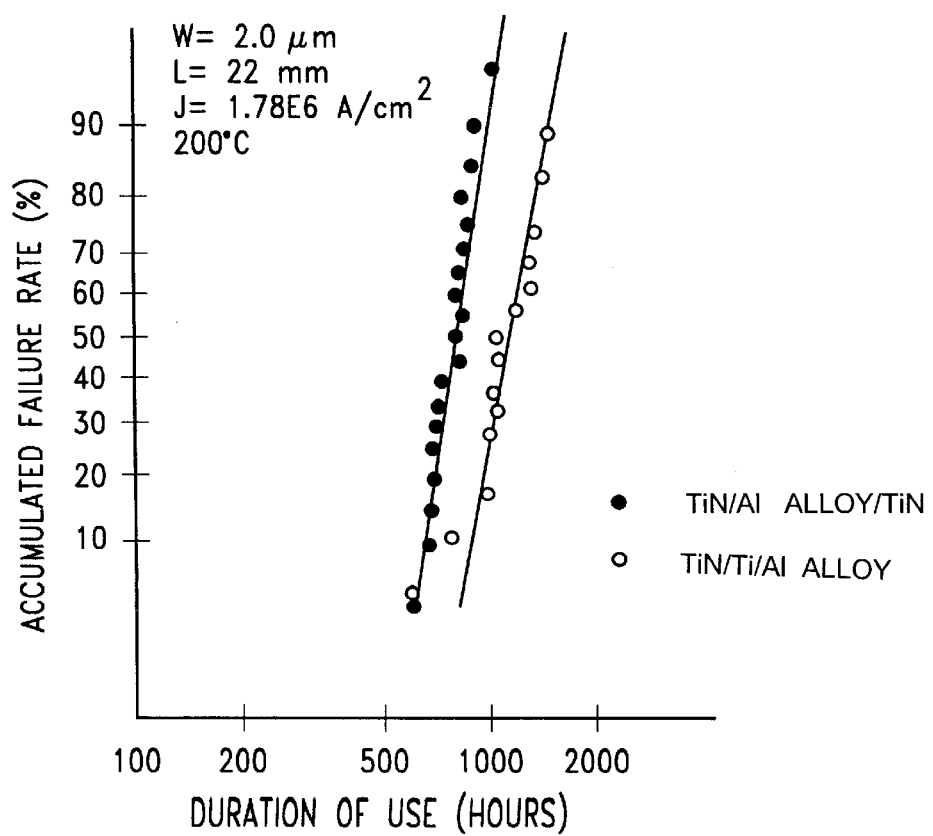
FIG. 4 is a graph showing comparative results of a test measuring the effect of electromigration on interconnects formed according to the invention and interconnection metalizations formed not according to the invention.

FIG. 4 shows a result of a test of electromigration in (i) interconnects according to the invention, each formed of an aluminum alloy layer (including Al, Si and Cu), a titanium layer on the alloy layer, and a titanium nitride layer on the titanium layer (TiN/Ti/Al alloy), and (ii) interconnects formed of a first titanium nitride layer, an aluminum alloy layer (including Al, Si and Cu) on the first nitride layer, and a second titanium nitride layer on the alloy layer (TiN/Al alloy/TiN). In the latter interconnects, the first titanium nitride layer serves as a diffusion barrier. The former interconnects were formed on a substrate without an intervening diffusion barrier.

In this test, the width of each interconnect had a width of 2.0 μm, and a length of 22 mm. An electric current density of $1.78 \times 10^6 A/cm^2$ was applied in each interconnect in an environment in which the ambient temperature was 200° C. As is apparent from FIG. 4, the operating times before the TiN/Ti/Al alloy interconnects of the invention failed (indicated by the unfilled circles), were longer than that before the TiN/Al alloy/TiN interconnects failed (indicated by block filled circles). This result was observed despite the fact that the TiN/Ti/Al alloy interconnects did not include diffusion barriers. Thus, the test clearly demonstrates the improved reliable provided by the invention. Moreover, since a reliable interconnect is obtained without any diffusion barrier, vias can be used reliably to provide for contact between the aluminum alloy layers in a device containing multiple metalization levels, such as is shown in FIG. 2.

Many modifications and variations of the structures and manufacturing processes of the invention as described above are contemplated, and examples are described below.

Although the metal layer and the metal nitride layer are formed of titanium and titanium nitride, respectively, in the embodiments described above, other metal and metal nitride layers are possible. For example, several transition metals, including refractory and noble metals, whose nitrides have low resistivity or are not easily nitrided in a nitrogen gas atmosphere, are suitable for the metal layer. These would include zirconium (Zr), hafnium (Hf), vanadium (V) and niobium (Nb), whose nitrides have low resistivity, and tungsten (W), molybdenum (Mo), cobalt (Co), nickel (Ni), platinum (Pt) and palladium (Pd), which are not easily nitrided. The nitrides ZrN, HfN, VN and NbN may be suitable for the metal nitride layer.

The metal for the metal layer may be selected on the following basis. Since the sputtering chamber is occupied by nitrogen gas when the nitride is deposited, the surface of the layer previously deposited may be slightly nitrided. Therefore, the metal layer between the nitride and the aluminum alloy layer is required to maintain a low resistance even if exposed to the nitrogen gas. The requirement for low electrical resistance is satisfied if the metal layer has a resistivity in a range such that functions of the semiconductor device are never impaired. More specifically, the electrical resistance should be in a range from 50 to 500 mΩcm, or preferably, from 50 to 100 or 200 mΩcm. The resistivity of the metal layer will not be substantially increased by exposure to nitrogen gas, provided that the nitride of the metal of the metal layer has low resistivity, or the metal of the metal layer is not easily nitrided in the nitrogen atmosphere.

In the embodiments described above, the aluminum alloy layer contains 98.5% aluminum, 1% silicon, and 0.5% copper. However, the components of the aluminum alloy layer can have other proportions and other compositions, for example, Al-Si-Cu in other proportions, and such other compositions such as Al-Si, Al-Cu, Al-Ti-Cu, Al-Si-Pd, Al-Si-Cu-Hf-B.

Although argon gas is used for sputtering to form the aluminum alloy layer in the embodiments described above, another gas that is non-reactive with aluminum may be used.

Although sputtering, preferably RF bias-sputtering, is used to form the metal and metal nitride layers in the embodiments described above, another vapor deposition method, such as thermal evaporation, may be used to form these layers in vacuum chambers.

Furthermore, although in the embodiments described above, the metal layer consists substantially of only one single chemical element, such as titanium, nickel, tungsten or molybdenum, an alloy metal having no aluminum may be used.

It is understood that although the invention has been described in detail with respect to preferred embodiments thereof, various other embodiments and variations thereof will be apparent to those skilled in the art, without departing from the scope of the invention, that is limited only by the following claims.

What is claimed is:

1. Method for manufacturing a semiconductor device having multi-layer metalization, comprising:
   a) providing an aluminum alloy layer; and
   b) preventing a formation of a layer having a high resistance while, in a vacuum chamber, successively and without intervening interruptions,
      (i) forming a metal layer on and in direct contact with the aluminum alloy layer, and
      (ii) forming a metal nitride layer on and in direct contact with the metal layer, the aluminum alloy layer and the metal nitride layer being conductively coupled together, whereby the metalization continues to conduct even if the aluminum alloy layer becomes non-conducting.

2. Method for manufacturing a semiconductor device according to claim 1, wherein said forming a metal layer and said forming a metal nitride layer include providing an inert gas atmosphere within the vacuum chamber, applying the metal layer onto the aluminum alloy layer in the inert gas atmosphere, replacing the inert gas atmosphere by a nitrogen gas atmosphere within the vacuum chamber, and applying the metal nitride layer onto the metal layer in the nitrogen gas atmosphere.

3. Method of manufacturing a semiconductor device according to claim 1, wherein the selected nitride is a nitride of the selected metal.

4. Method for manufacturing a semiconductor device having multi-layer metalization, comprising:
   (a) forming a first conductive layer in a vacuum chamber, including, in succession and without intervening interruption, so as to prevent formation of a layer having a high resistance
      forming a first aluminum alloy layer,
      forming a metal layer on the first aluminum alloy layer, the metal layer including a metal selected from the group consisting of Ti, Zr, Hf, V and Nb, and
      forming a metal nitride layer on the metal layer, the metal nitride layer including a nitride selected from the group consisting of TiN, ZrN, HfN, VN and NbN, with the aluminum alloy layer and the metal nitride layer being conductively coupled together;
   (c) forming an insulating layer on the first conductive layer;
   (d) forming a via in the insulating layer, so that a surface of the first aluminum alloy layer is exposed through the via; and
   (e) forming a second conductive layer on the insulating layer and the exposed surface of the first aluminum alloy layer, so that the second conductive layer is in contact with the first aluminum alloy layer at the via, whereby the metalization continues to conduct even if the first aluminum alloy layer becomes non-conducting.

5. Method for manufacturing a semiconductor device according to claim 4, wherein said forming a second conductive layer includes in succession and without interruption
   forming a second aluminum alloy layer,
   forming a second metal layer on the second aluminum alloy layer, the second metal layer including a metal selected from the group consisting of Ti, Zr, Hf, V, and Nb, and
   forming a second metal nitride layer on the second metal layer, the second metal nitride layer including a nitride selected from the group consisting of TiN, ZrN, HfN, and MbN.

6. Method for manufacturing a semiconductor device having multi-layer metalization, comprising:
   (a) forming an insulating layer on a surface of a substrate;
   (b) forming an aluminum alloy layer on the insulating layer;
   (c) forming a metal layer on the aluminum alloy layer, the metal layer including a metal selected from the group consisting of Ti, Zr, Hf, V and Nb; and
   (d) forming a metal nitride layer on the metal layer, the metal nitride layer comprising a nitride selected from the group consisting of TiN, ZrN, HfN, VN and NbN; wherein said forming an aluminum alloy layer, said forming a metal layer and said forming a metal nitride layer are performed successively and without interruption in a vacuum chamber to prevent a formation of a layer having a high resistance, so that the aluminum alloy layer is conductively coupled to the metal nitride layer, whereby the metalization continues to conduct even if the aluminum alloy layer becomes non-conducting.

7. Method for manufacturing a semiconductor device according to claim 6, wherein the aluminum alloy layer is formed in a first vacuum chamber, and the metal layer and the metal nitride layer are formed in a second vacuum chamber.

8. Method for manufacturing a semiconductor device having multi-layer metalization, comprising:
   (a) forming an insulating layer on a surface of a substrate;
   (b) forming an aluminum alloy layer on the insulating layer;
   (c) applying, directly onto an upper surface of the aluminum alloy layer in a vacuum chamber, a layer of material consisting of metal selected from the group consisting of Ti, Zr, Hf, V and Nb; and
   (d) in the vacuum chamber, immediately following said applying a layer of material, applying, directly onto an upper surface of the metal layer, a layer of metal nitride, the metal nitride being a nitride of the selected metal, said applying a layer of material and said applying a layer of metal nitride preventing a formation of a layer having a high resistance, so that the aluminum alloy layer is conductively coupled to the metal nitride layer, whereby the metalization continues to conduct even if the aluminum alloy layer becomes non-conducting.

9. Method for manufacturing a semiconductor device according to claim 8, wherein said said applying a layer of material and said applying a layer of metal nitride include providing the substrate in the vacuum chamber, providing an inert gas atmosphere within the vacuum chamber, applying the metal layer onto the aluminum alloy layer in the inert gas atmosphere, replacing the inert gas atmosphere by a nitrogen gas atmosphere within the vacuum chamber, and applying the metal nitride layer onto the metal layer in the nitrogen gas atmosphere.

10. Method for manufacturing a semiconductor device having multi-layer metalization, comprising:
   (a) forming a first conductive layer in a vacuum chamber, including in succession and without interruption so as to prevent a formation of a layer having a high resistance
      forming a first aluminum alloy layer,
      applying a first layer of metal directly onto an upper surface of the first aluminum alloy layer, the metal being selected from the group consisting of Ti, Zr, Hf, V and Nb, and
      applying a first layer of metal nitride directly onto an upper surface of the first metal layer, the metal nitride being selected from the group consisting of TiN, ZrN, HfN, VN and NbN, the aluminum alloy layer and the metal nitride layer being conductively coupled together;
   (c) forming an insulating layer on an upper surface of the first conductive layer;
   (d) forming a via in the insulating layer, so that the upper surface of the first aluminum layer is exposed through the via; and
   (e) forming a second conductive layer on the insulating layer and the exposed surface of the first aluminum alloy layer, so that the second conductive layer is in contact with the first aluminum alloy layer at the via, whereby the metalization continues to conduct even if the aluminum alloy layer becomes non-conducting.

11. Method for manufacturing a semiconductor device according to claim 10, wherein said forming a second conductive layer includes;

forming a second aluminum alloy layer on the insulating layer and the exposed surface of the first aluminum alloy layer, so that the second aluminum alloy layer is in contact with the first aluminum alloy layer at the via, in a vacuum atmosphere, applying a second layer of metal directly onto the second aluminum alloy layer, the metal of the second layer of metal being selected from the group consisting of Ti, Zr, Hf, V and Nb, and in the vacuum atmosphere immediately following said applying a second layer of metal, applying a second layer of metal nitride directly onto an upper surface of the second metal layer, the metal nitride of the second layer of metal nitride being selected from the group consisting of TiN, ZrN, HfN, VN and NbN.

12. Method of manufacturing a semiconductor device according to claim 11, wherein in said forming a first conductive layer and said forming a second conductive layer, the selected nitride is a nitride of the selected metal.

13. Method of manufacturing a semiconductor device according to claim 10, wherein in said forming a first conductive layer, the selected nitride is a nitride of the selected metal.

14. Method for manufacturing a semiconductor device having multi-layer metalization, comprising:

(a) forming an insulating layer on a surface of a substrate;

(b) forming an aluminum alloy layer on the insulating layer;

(c) applying a layer of metal directly onto an upper surface the alloy layer, the metal layer including a metal selected from the group consisting of Ti, Zr, Hf, V and Nb; and (d) immediately following said applying a layer, forming a layer of metal nitride on an upper surface of the metal layer, the metal nitride layer comprising a nitride selected from the group consisting of TiN, ZrN, HfN, VN and NbN;

wherein said forming an aluminum layer, said applying a layer of metal, and said forming a layer of metal nitride are performed successively in a vacuum chamber to prevent a formation of a layer having a high resistance, so that the aluminum alloy layer is conductively coupled to the metal nitride layer, whereby the metalization continues to conduct even if the aluminum alloy layer becomes non-conducting.

15. Method for manufacturing a semiconductor device according to claim 14, wherein the aluminum alloy layer is formed in a first vacuum chamber, and the metal layer and the metal nitride layer are formed in a second vacuum chamber.

16. Method of manufacturing a semiconductor device according to claim 14, wherein in said forming a layer of metal nitride, the selected nitride is a nitride of the selected metal.

* * * * *